(12) United States Patent
Hirata et al.

(10) Patent No.: US 6,731,911 B1
(45) Date of Patent: May 4, 2004

(54) METHOD OF PERFORMING AUTOMATIC FREQUENCY CONTROL IN MOBILE STATION IN WAITING MODE (75) Inventors: Masaru Hirata, Tokyo (JP); Kazuhiro Arimitsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/410,383

(22) Filed: Sep. 30, 1999

(51) Int. Cl.$^7$ ................................................ H04B 1/00
(52) U.S. Cl. ............................ 455/71; 455/75; 455/515; 375/344; 370/342
(58) Field of Search ............................ 455/71, 75, 515, 455/150.1, 164.1, 68, 70, 255, 257; 375/344; 370/335, 342

(56) References Cited

U.S. PATENT DOCUMENTS

| | | | |
|---|---|---|---|
| 4,031,549 A | * 6/1977 | Rast et al. .............. 331/DIG. 2 |
| 4,955,083 A | 9/1990 | Phillips et al. |
| 5,228,026 A | * 7/1993 | Albrow et al. .............. 370/280 |
| 5,361,276 A | 11/1994 | Subramanian |
| 5,390,216 A | * 2/1995 | Bilitza et al. ................ 370/328 |
| 5,410,588 A | 4/1995 | Ito |
| 5,594,754 A | 1/1997 | Dohi et al. |
| 5,678,223 A | * 10/1997 | Callaway et al. ......... 455/182.1 |
| 5,742,908 A | * 4/1998 | Dent ........................... 342/358 |
| 6,215,990 B1 | * 4/2001 | Kidd ........................... 331/176 |

FOREIGN PATENT DOCUMENTS

| | | |
|---|---|---|
| EP | 0 845 860 A1 | 6/1998 |
| EP | 0 853 389 A2 | 7/1998 |
| JP | 63-108827 | 5/1988 |
| JP | 4-274627 | 9/1992 |
| JP | 06021915 | 1/1994 |
| JP | 6-501349 | 2/1994 |
| JP | 6-216876 | 8/1994 |
| JP | 6-252883 | 9/1994 |
| JP | 9-8699 | 1/1997 |
| JP | 9-68946 | 3/1997 |
| JP | 9-83484 | 3/1997 |
| JP | 09298492 | 11/1997 |
| JP | 10-3280 | 1/1998 |
| JP | 10126310 | 5/1998 |
| JP | 10164658 | 6/1998 |
| JP | 10-187091 | 7/1998 |

OTHER PUBLICATIONS

Patent Abstract of Japan 10126310 dated May 15, 1998.

* cited by examiner

Primary Examiner—Edward F. Urban
Assistant Examiner—Ronald J. Ward
(74) Attorney, Agent, or Firm—Scully, Scott, Murphy & Presser (57) ABSTRACT

An AFC process is performed even when a mobile station is in a waiting mode in which an incoming call is monitored via a paging channel. Even in the waiting mode, a finger receiver receives a BCCH, and an AFC circuit carries out the AFC process using the BCCH. No reception failure occurs even when a TCXO, i.e., a reference oscillator, suffers frequency fluctuations in the waiting mode.

4 Claims, 13 Drawing Sheets

METHOD OF PERFORMING AUTOMATIC FREQUENCY CONTROL IN MOBILE STATION IN WAITING MODE

BACKGROUND OF THE INVENTION

1. Field of the Invention

The present invention relates to a CDMA (Code Division Multiple Access) communication system, and more particularly to a method of performing an AFC (Automatic Frequency Control) process in a mobile station in such CDMA communication system.

2. Description of the Related Art

Recent years have seen much attention to a CDMA communication system that is highly resistant to interferences and disturbances as a mobile communication system. In the CDMA communication system, a transmitting station spreads a user signal to be transmitted with a spreading code and transmits the spread signal, and a receiving station despreads the spread signal using a spreading code which is the same as the spreading code used by the transmitting station for thereby obtaining the original user signal.

The receiving station cannot despread the spread signal unless the spreading codes used in the transmitting and receiving stations are synchronized in phase with each other. To achieve the spreading code synchronization, mobile stations of the CDMA communication system use a TCXO (Temperature Controller Xtal Oscillator) of very high frequency accuracy as a reference oscillator for generating a reference frequency signal for use in demodulating signals received from a base station, and perform an AFC process for equalizing the frequency of the reference frequency signal to the frequency of a reference frequency signal of the base station which serves as a transmitting station.

The AFC process is carried out based on a pilot symbol contained in data that are transmitted from the base station to the mobile station.

Figure 1:
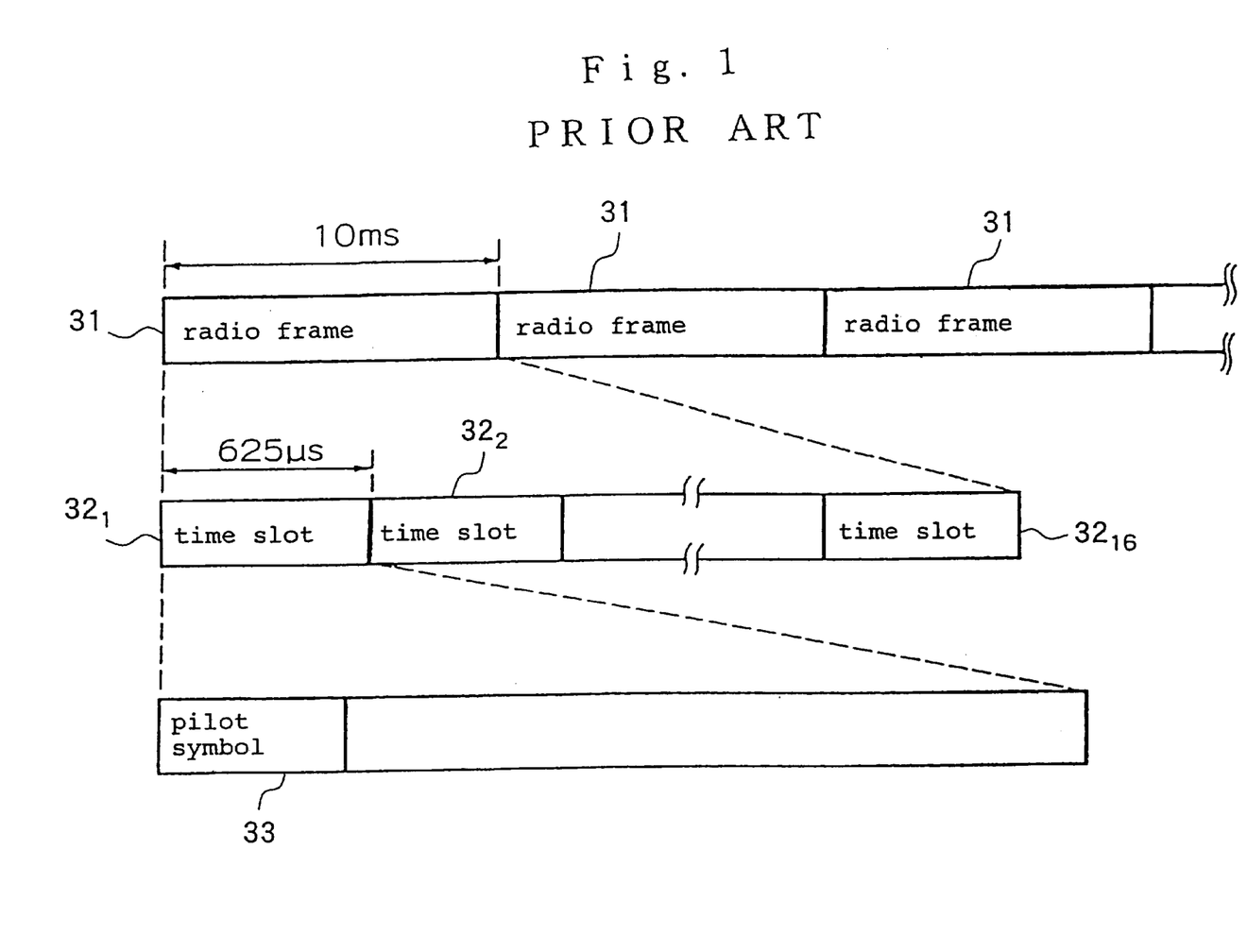
FIG. 1 is a diagram showing the physical format of a down link in a CDMA communication system.

The physical format of a down link for data transmission from a base station to a mobile station will be described below with reference to FIG. 1 of the accompanying drawings.

Data transmitted from the base station comprises a plurality of radio frames 31 each having an interval of 10 ms. Each of the radio frames 31 comprises 16 time slots $32_1$ through $32_{16}$. Each of the time slots $32_1$ through $32_{16}$ contains pilot symbols 33. While the pilot symbols 33 have different values depending on the time slots $32_1$ through $32_{16}$, they have a predetermined pattern. Therefore, the mobile station is capable of recognizing pilot symbols to be transmitted before receiving the pilot symbols. There are four pilot symbols contained in each time slot. The mobile station can measure a frequency error with respect to the base station using the four pilot symbols per time slot.

Figure 2:
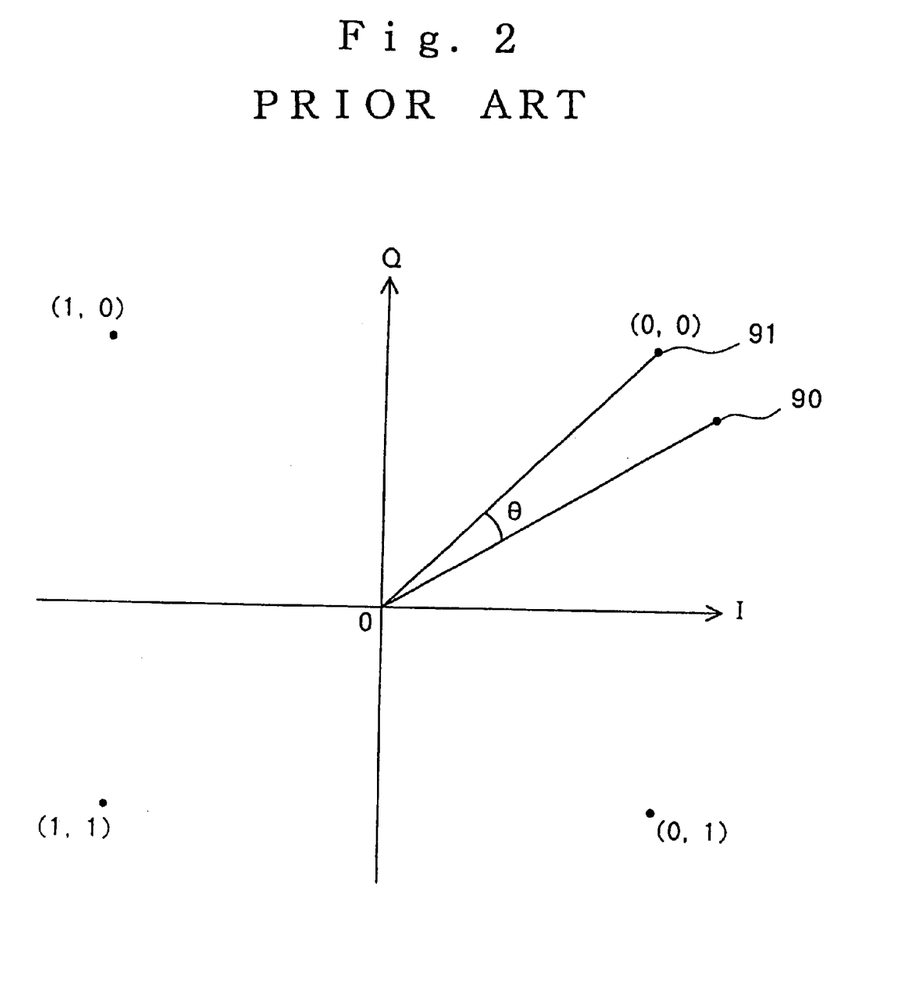
FIG. 2 is a vector diagram illustrative of a frequency error.

The frequency error will be described below with reference to FIG. 2 of the accompanying drawings. In the CDMA communication system, QPSK (Quadrature Phase Shift Keying) is employed as a primary modulation process to be effected on data before the data is spread, and hence each symbol comprises 2-bit data, i.e., each symbol takes a value of (0, 0), (0, 1), (1, 0), or (1, 1). These values as plotted in a vector diagram are shown in FIG. 2. In FIG. 2, the horizontal axis represents the magnitude of an In-phase component (I) and the vertical axis the magnitude of a Quadrature component (Q). In FIG. 2, a frequency error between measured data 91 of a first pilot symbol and measured data 90 of a second pilot symbol is θ.

Immediately after a mobile station in a CDMA mobile communication system is turned on, the mobile station performs an AFC process using a BCCH (Broadcast Control Channel). When the frequency error between a reference frequency and the frequency of a signal received from the base station becomes smaller than a certain value, the mobile station determines the frequency as locked, and terminates the AFC process.

Operation of the mobile station after it has been turned on and until it enters a waiting mode will be described below with reference to FIG. 3 of the accompanying drawings. When the mobile station is turned on, the mobile station receives all BCCHs which can be received in step 201, and identifies a base station which is transmitting the BCCH whose field intensity is greatest, i.e., whose S/N ratio is best, of all the received BCCHs, in step 202. A BCCH is a one-way control channel for broadcasting control information from the base station to the mobile station.

In step 203, the mobile station transmits information such as of an ID number of the base station to the base station via a RACH (Random Access Channel). The base station transmits various items of information to the mobile station via a FACH (Forward Access Channel) in step 204.

The mobile station stores the received information, and enters a waiting mode for receiving a PCH (Paging Channel) from the base station in steps 205, 206.

If the mobile station is notified of an incoming call via the PCH in step 206, then the mobile station receives a BCCH to obtain information again from the base station in step 207. In step 208, the mobile station receives a DTCH (Data Channel) to begin speech communications. When the speech communications end, the mobile station enters the waiting mode again in steps 205, 206.

In step 201 or 202 immediately after the mobile station is turned on, the mobile station performs the AFC process using the received BCCH. Once the frequency is locked in the AFC, the mobile station does not perform the AFC process again.

However, if the mobile station remains in the waiting mode for a long period of time or the ambient temperature of the mobile station varies greatly, then the frequency of the TCXO as the reference oscillator also varies. As a consequence, an error between the reference frequency of the base station and the reference frequency of the mobile station becomes greater than a certain value, so that the mobile station tends to fail to properly despread data transmitted from the base station.

SUMMARY OF THE INVENTION

It is therefore an object of the present invention to provide a method of performing an AFC process in a mobile station for preventing received data from failing to be despread even if the frequency of a reference oscillator fluctuates in a waiting mode.

To achieve the above object, in accordance with an aspect of the present invention, there is provided a method of performing an automatic frequency control process in a mobile station to equalize the frequency of a reference frequency signal for use in demodulating a signal received from a base station, with the frequency of a reference frequency signal in the base station. The automatic frequency control process is carried out in a waiting mode in which a paging channel transmitted from the base station to indicate whether there is an incoming call or not is being received.

According to another aspect of the present invention, the automatic frequency control process is carried out using a paging channel transmitted from the base station to indicate whether there is an incoming call or not, or a broadcast control channel, in a waiting mode in which the paging channel is being received.

According to still another aspect of the present invention, if a frequency error measured using a paging channel transmitted from the base station to indicate whether there is an incoming call or not is greater than a predetermined value, the automatic frequency control process is carried out using a broadcast control channel in a waiting mode in which the paging channel is being received.

With the above arrangements, since the AFC process is carried out using the paging channel or the broadcast control channel even in the waiting mode in which an incoming call is monitored via the paging channel, no reception failure occurs even when a reference oscillator suffers frequency fluctuations in the waiting mode.

According to yet another aspect of the present invention, the automatic frequency control process is carried out using a broadcast control channel when the broadcast control channel is received after an incoming call has been indicated by a paging channel transmitted from the base station and before speech communications for receiving a data channel begin.

With the above arrangement, because the AFC process is carried out using the broadcast control channel after the waiting mode and before speech communications begin, the AFC process can be performed without the need for any special processing for receiving the broadcast control channel.

The AFC process may be carried out by controlling a reference oscillator which generates the reference frequency signal.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 4:
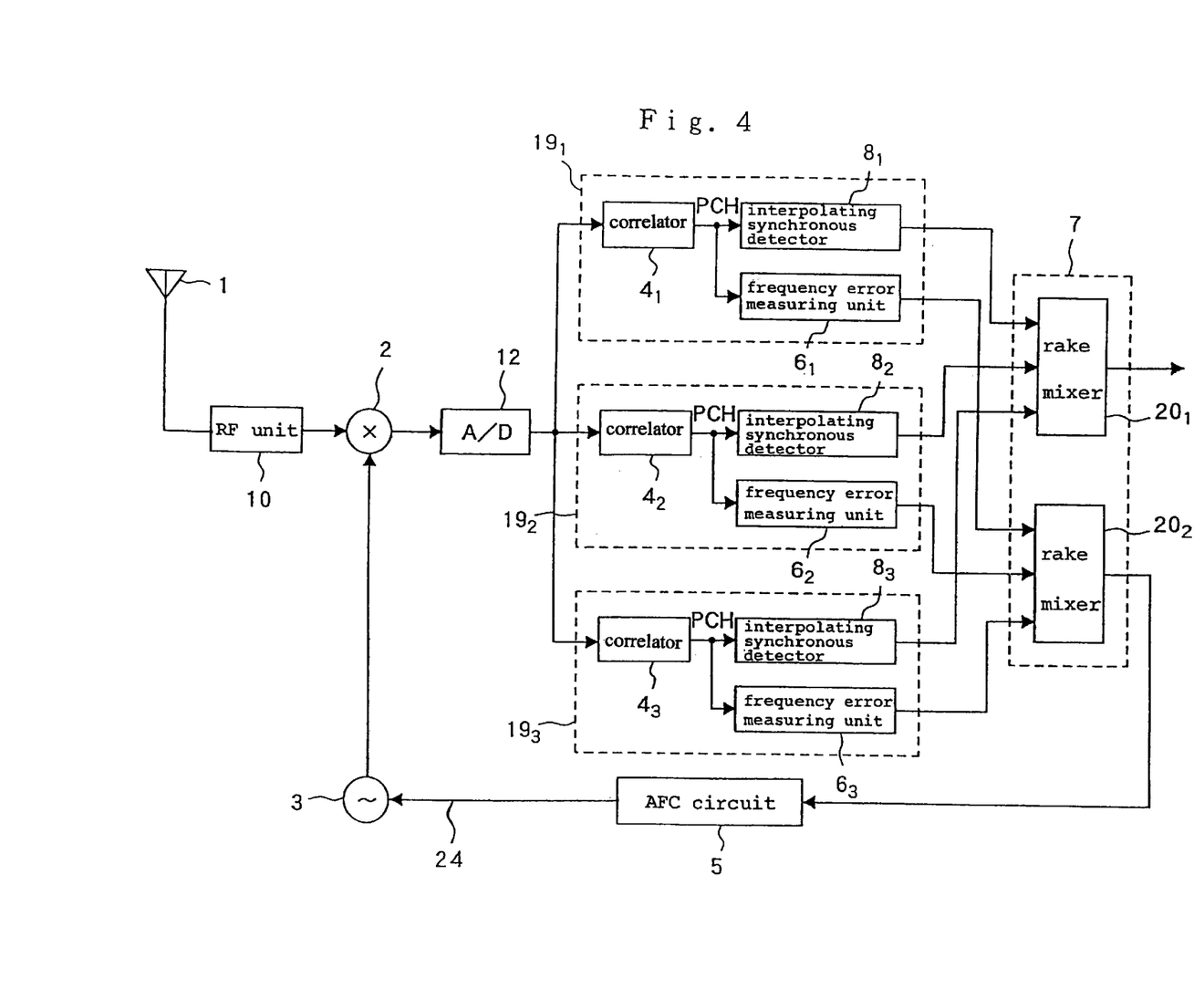
FIG. 4 is a block diagram of a mobile station according to a first embodiment of the present invention.

As shown in FIG. 4, a mobile station according to a first embodiment of the present invention comprises an antenna 1, an RF (Radio Frequency) unit 10, a mixer 2, a TCXO 3, an A/D converter 12, a plurality of finger receivers $19_1$ through $19_3$, an AFC circuit 5, and a rake mixer assembly 7.

The finger receivers $19_1$ through $19_3$ comprise respective correlators $4_1$ through $4_3$, respective interpolating synchronous detectors $8_1$ through $8_3$, and respective frequency error measuring units $6_1$ through $6_3$.

The RF unit 10 selects a signal having a certain frequencies from signals received by the antenna 1, amplifies the selected signal, and outputs the amplified signal as a high-frequency signal.

The mixer 2 multiplies the high-frequency signal from the RF unit 10 by a reference frequency signal generated by the TCXO 3 for thereby converting the high-frequency signal into a baseband signal at a chip rate. The TCXO 3 outputs, as the reference frequency signal, a signal whose frequency has been controlled by a control voltage 24 from the AFC circuit 5. The A/D converter 12 converts the baseband signal at the chip rate from the mixer 2 into a digital signal.

The correlators $4_1$ through $4_3$ despread the digital signal from the A/D converter 12 using a spreading code corresponding to a paging channel (PCH) thereby to demodulate PCH data. The interpolating synchronous detectors $8_1$ through $8_3$ determine phase errors from pilot symbols contained in desired signals produced by the correlators $4_1$ through $4_3$, and correct the desired signals so as to reduce the phase errors. Operation of the interpolating synchronous detectors $8_1$ through $8_3$ will be described below with reference to FIGS. 5 and 6.

Figure 5:
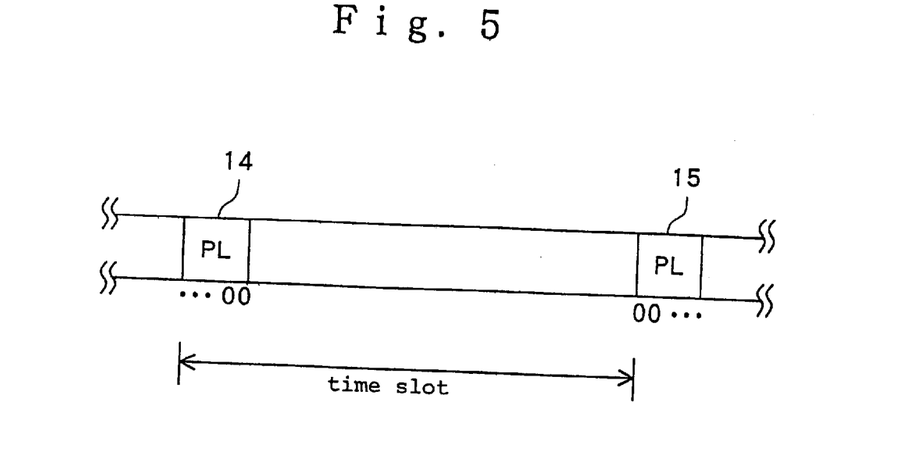
FIG. 5 is a diagram of a signal format illustrative of operation of interpolating synchronous detectors.

It is assumed that data are to be transmitted in which a pilot symbol 14 in a certain time slot is (0, 0) and a pilot symbol 15 in a next time slot is also (0, 0).

Figure 6:
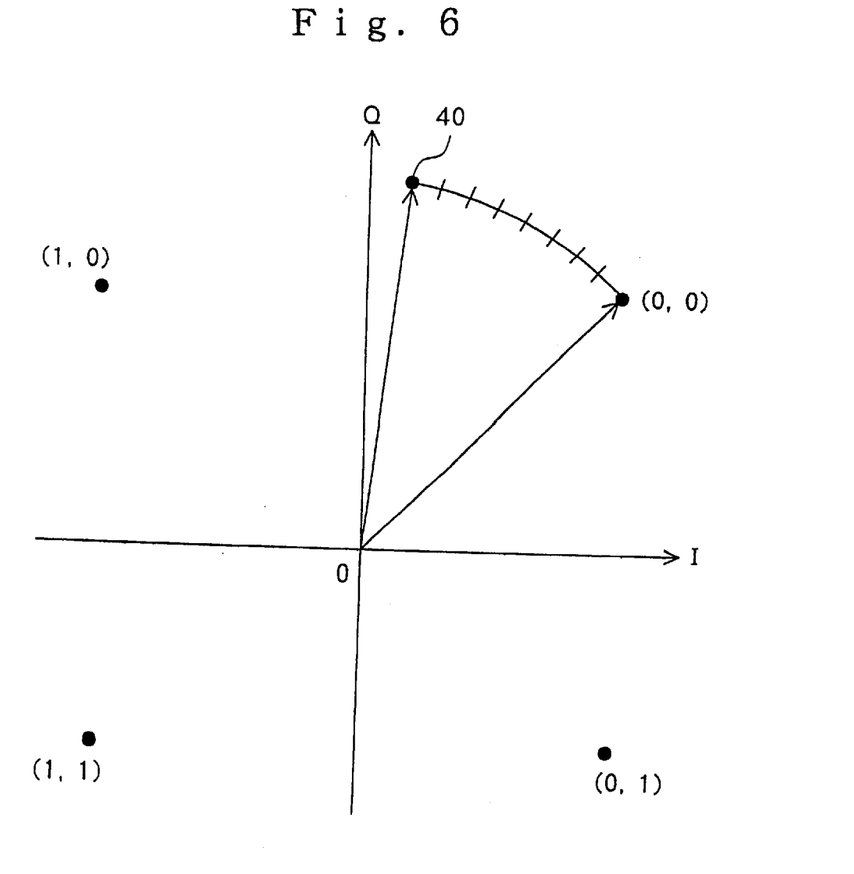
FIG. 6 is a vector diagram illustrative of operation of the interpolating synchronous detectors.

The data whose pilot symbol is (0, 0) is shown at a position (0, 0) in FIG. 6 if the data does not contain any phase error in an ideal state. However, if the value of the pilot symbol 15 is obtained at a position indicated as measured data 40 though the value of the pilot symbol 15 is obtained at the position (0, 0), then it is presumed that a phase error has occurred in an interval after the pilot symbol 14 is received until the pilot symbol 15 is received. Therefore, the interpolating synchronous detectors $8_1$ through $8_3$ determine that measured values of other symbols between the symbols 14, 15 similarly contain a phase error, and correct phase error components estimated with respect to the obtained values.

The frequency error measuring units $6_1$ through $6_3$ determine frequency errors from pilot symbols contained in desired signals produced by the correlators $4_1$ through $4_3$. The rake mixer assembly 7 comprises a rake mixer $20_1$ and a rake mixer $20_2$.

The rake mixer $20_1$ combines signal's which have been corrected in phase by the interpolating synchronous detectors $8_1$ through $8_3$, at a maximum ratio. The rake mixer $20_2$ combines frequency error signals from the frequency error measuring units $6_1$ through $6_3$ at a maximum ratio.

Figure 7:
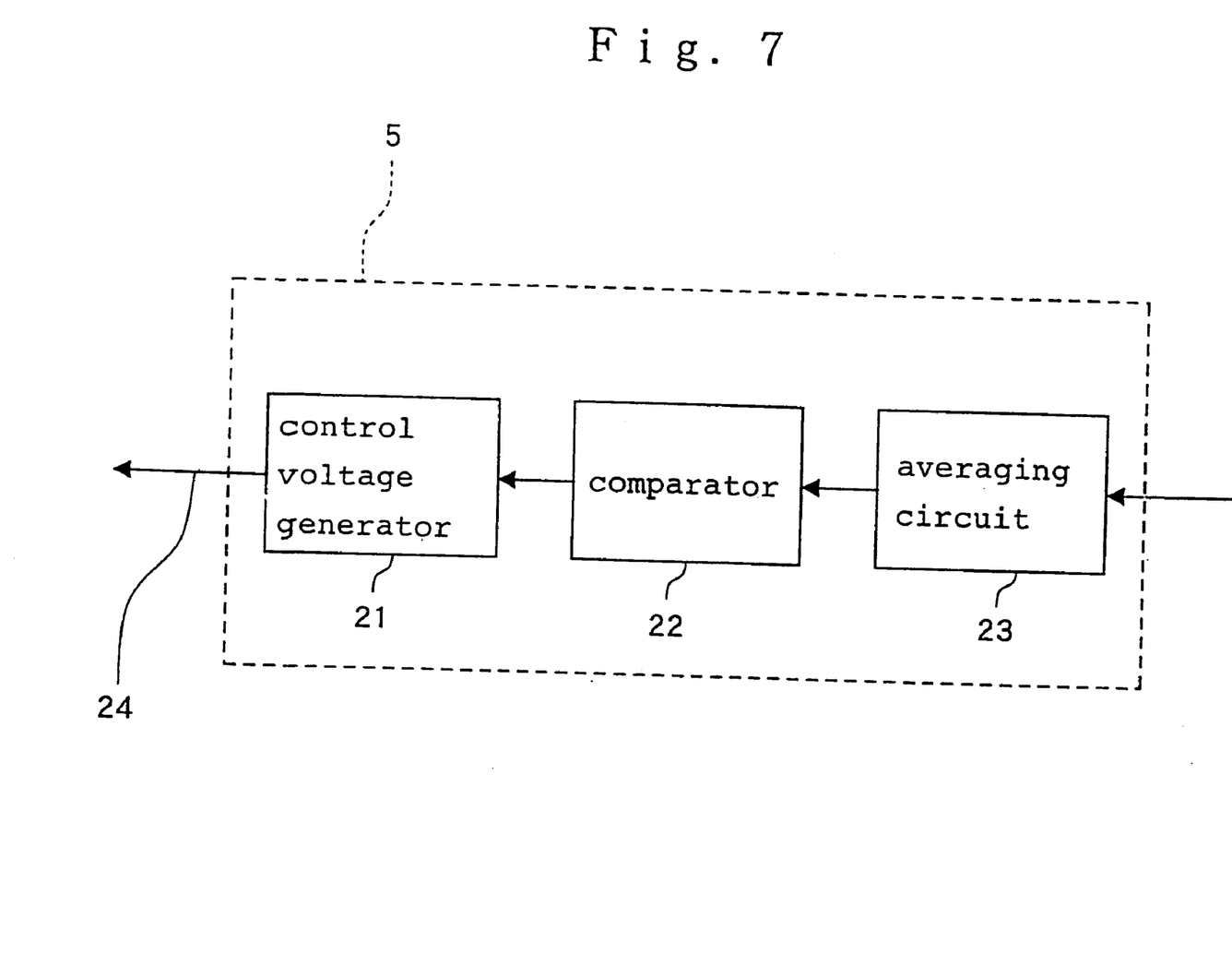
FIG. 7 is a block diagram of an AFC circuit in the mobile station shown in FIG. 4.

As shown in FIG. 7, the AFC circuit 5 comprises an averaging circuit 23, a comparator 22, and a control voltage generator 21.

The averaging circuit 23 determines an average of frequency errors determined by the rake mixer $20_2$. The comparator 22 compares the average determined by the averaging circuit 23 with a predetermined value. Based on the compared result from the comparator 22, the control voltage generator 21 generates and outputs a control voltage 24 for controlling an output frequency from the TCXO 3. The control voltage generator 21 also maintains the control voltage 24 at a constant level after the frequency is locked in the AFC circuit 5.

Operation of the mobile station according to the first embodiment will be described in detail below with reference to FIG. 4.

An RF signal from the antenna 1 is frequency-converted into a chip rate signal by the mixer 2, and the chip rate signal is converted into a digital signal by the A/D converter 12. The digital signal is supplied to the finger receivers $19_1$ through $19_3$ in which it is despread by the correlators $4_1$ through $4_3$ to demodulate a PCH. The interpolating synchronous detectors $8_1$ through $8_3$ remove fading from the PCH, and the rake mixer $20_1$ combines the signals at a maximum ratio and outputs the combined signal.

The PCH demodulated by the correlators $4_1$ through $4_3$ is supplied to the frequency error measuring units $6_1$ through $6_3$, which determine frequency errors. The frequency errors determined by the frequency error measuring units $6_1$ through $6_3$ are combined at a maximum ratio by the rake mixer $20_2$, which supplies the frequency errors to the AFC circuit 5. In the AFC circuit 5, the averaging circuit 23 calculates an average of the frequency errors supplied from the rake mixer $20_2$, and the comparator 22 compares with the average with a predetermined value. The control voltage generator 21 generates and outputs a control voltage 24 for controlling the frequency of the reference frequency signal from the TCXO 3 based on the compared result from the comparator 22, preferably if an error greater than a certain value occurs between the average and the predetermined value.

The frequency of the reference frequency signal from the TCXO 3 is controlled by the AFC process in the AFC circuit 5 to synchronize the chip rate signal from the mixer 2 with the reference frequency of the base station.

In the mobile station according to the first embodiment, since the AFC process (in step 205 shown in FIG. 3) using the PCH is carried out even in the waiting mode, no reception failure occurs even if the TCXO 3 suffers frequency fluctuations in the waiting mode.

Figure 3:
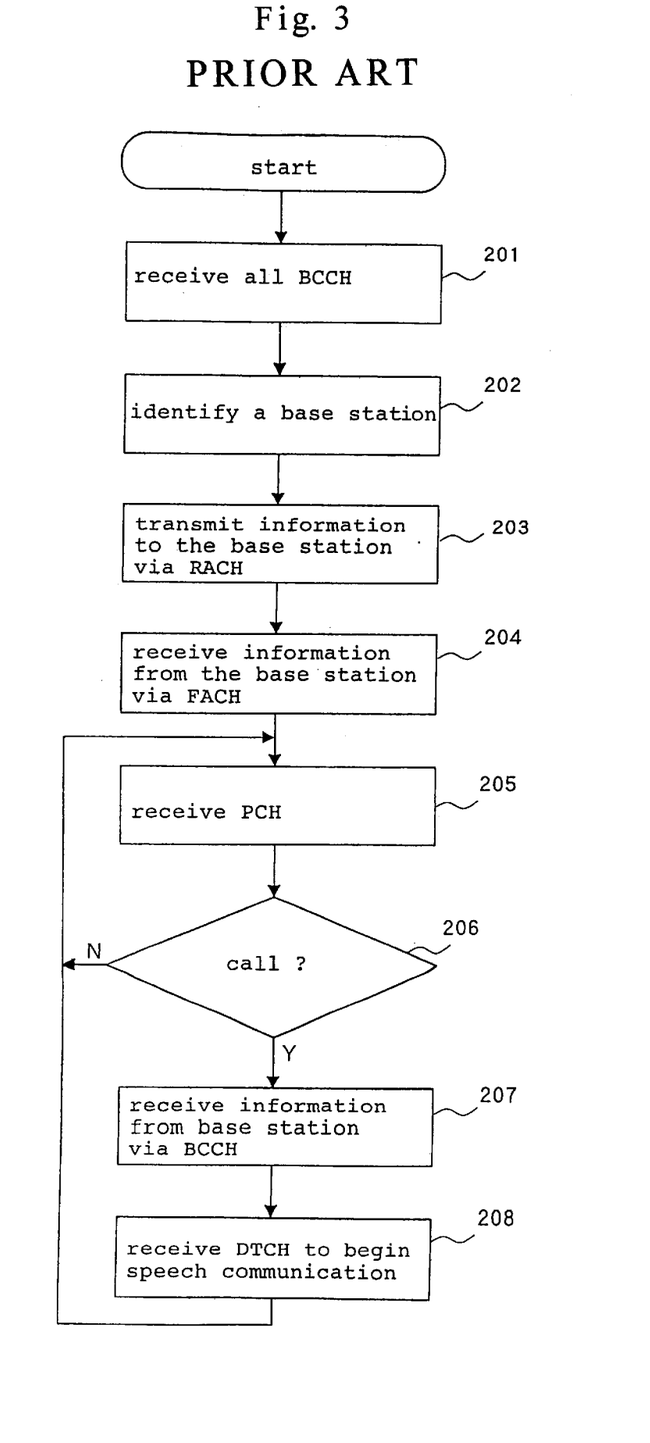
FIG. 3 is a flowchart of an operation sequence of a general mobile station.

A basic operation sequence of the mobile station according to the first embodiment, ranging from the time it is turned on to the waiting mode or speech communications, is the same as the operation sequence shown in FIG. 3, except for the features of the first embodiment as described above. Phase control for the finger receivers in a multipath environment is carried out by a search engine (not shown), but will not be described in detail as it has no direct bearing on the present invention.

2nd Embodiment

Figure 8:
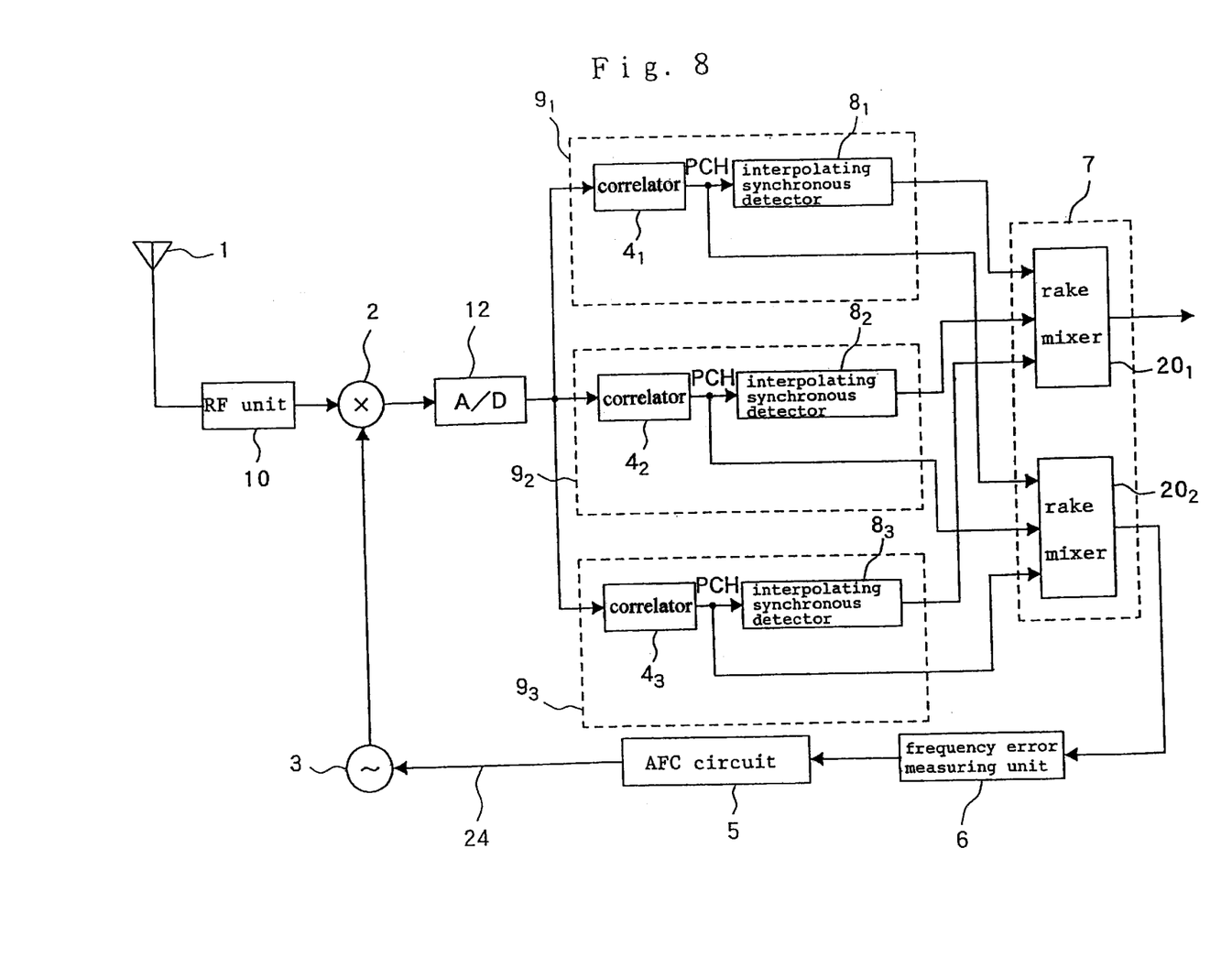
FIG. 8 is a block diagram of a mobile station according to a second embodiment of the present invention.

As shown in FIG. 8, a mobile station according to a second embodiment of the present invention differs from the mobile station according to the first embodiment shown in FIG. 4 in that the finger receivers $19_1$ through $19_3$ according to the first embodiment are replaced with finger receivers $9_1$ through $9_3$, respectively, and a frequency error measuring unit 6 is newly added.

The finger receivers $9_1$ through $9_3$ shown in FIG. 8 differ from the finger receivers $19_1$ through $19_3$ shown in FIG. 4 in that they do not have the respective frequency error measuring units $6_1$ through $6_3$.

According to the second embodiment, the rake mixer $20_2$ combines and outputs signals despread by the correlators $4_1$ through $4_3$ at a maximum ratio.

The frequency error measuring unit 6 according to the second embodiment operates in the same manner as the frequency error measuring units $6_1$ through $6_3$ shown in FIG. 4. The frequency error measuring unit 6 measures a frequency error of the output signal from the rake mixer $20_2$, and outputs the measured frequency error to the AFC circuit 5.

In the first embodiment shown in FIG. 4, frequency errors are measured from the signals despread by the finger receivers $19_1$ through $19_3$, and combined at a maximum ratio. Therefore, the finger receivers $19_1$ through $19_3$ require the respective frequency error measuring units $6_1$ through $6_3$.

According to the second embodiment, however, the signals despread by the finger receivers $9_1$ through $9_3$ are combined at a maximum ratio by the rake mixer $20_2$, and thereafter the frequency error measuring unit 6 measures a frequency error of the output signal from the rake mixer $20_2$. Consequently, the mobile station according to the second embodiment performs the same function as the mobile station according to the first embodiment with the single frequency error measuring unit.

3rd Embodiment

In the first and second embodiments, the AFC process is carried out using the PCH in the waiting mode while the PCH is being received. However, since the PCH is a channel transmitted in a burst under time slot management, the PCH contains a small number of data. Therefore, the AFC process that is carried out using the PCH is time-consuming. As a result, if the TCXO 3 suffers quick frequency fluctuations that are faster than the rate of the AFC process, then the frequency correction according to the AFC process may not be able to follow fluctuations of the reference frequency.

A mobile station according to a third embodiment of the present invention carries out the AFC process using a BCCH that is being transmitted at all times from the base station in the waiting mode.

The mobile station according to the third embodiment will be described below with reference to FIG. 9. Those parts in FIG. 9 which are identical to those in FIG. 8 are denoted by identical reference numerals.

The mobile station according to the third embodiment differs from the mobile station according to the second embodiment shown in FIG. 8 in that it does not have the rake mixer $20_2$, the finger receiver $9_3$ is replaced with a finger receiver 13, and the AFC circuit 5 generates a control voltage 24 based on a frequency error from the finger receiver 13.

The finger receiver 13 comprises a correlator $4_3$ and a frequency error measuring unit 6. The correlator $4_3$ despreads a digital signal from the A/D converter 12 using a spreading code corresponding to a BCCH for thereby demodulating the data of the BCCH.

In the mobile station according to the third embodiment, the finger receivers $9_1$, $9_2$ receive a PCH to check if there is an incoming call or not, and the finger receiver 13 receives a BCCH to perform the AFC process.

Figure 10:
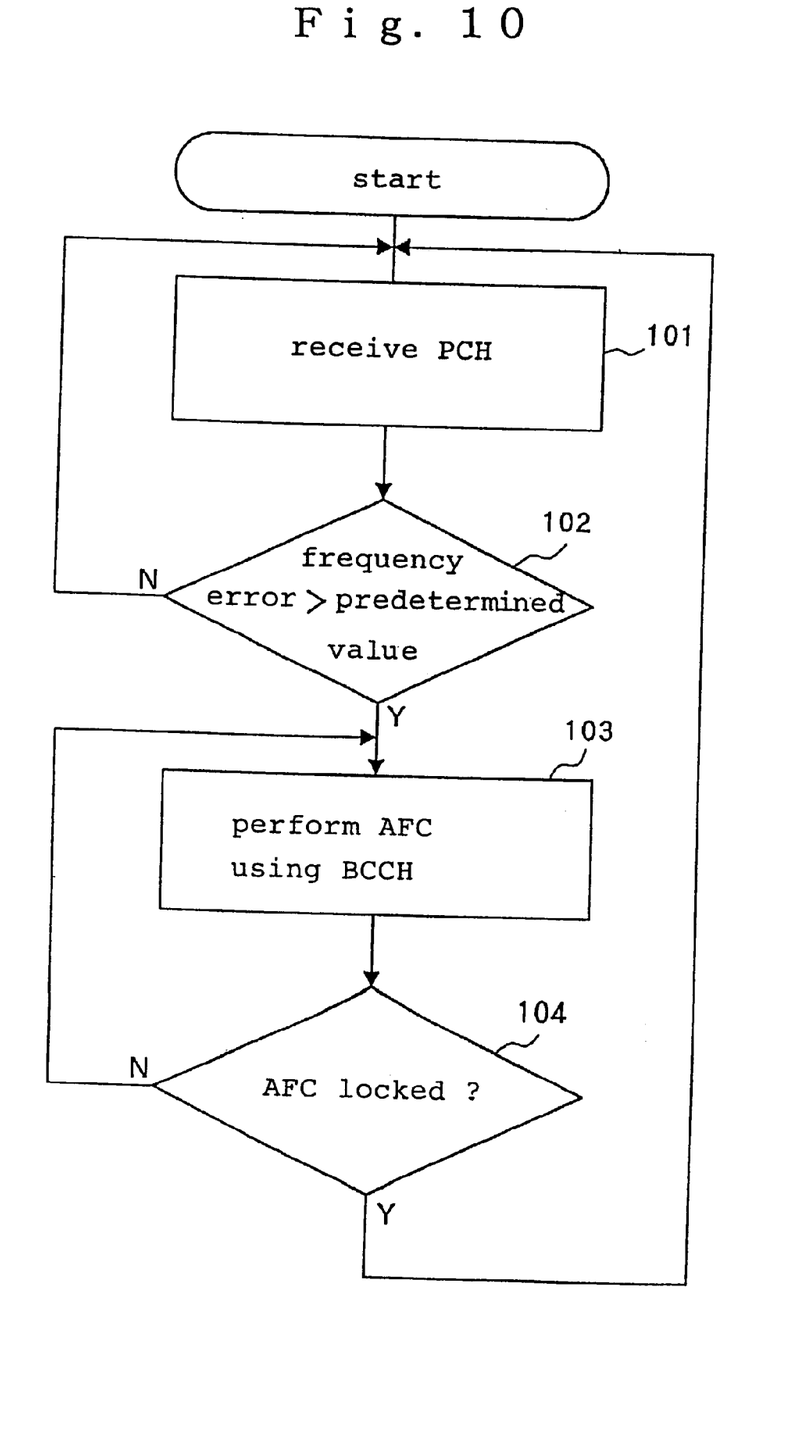
FIG. 10 is a flowchart of an operation sequence of the mobile station shown in FIG. 9.

An operation sequence of the mobile station according to the third embodiment with respect to the AFC process in the waiting mode will be described below with reference to FIG. 10.

In the waiting mode, the finger receivers $9_1$, $9_2$ in the mobile station receive a PCH to check if there is an incoming call or not in step 205 shown in FIG. 3. The finger receiver 13 receives a BCCH to determine a frequency error in the waiting mode in step 101. Then, the mobile station decides whether the frequency error is greater than a predetermined value or not in step 102.

If the frequency error is greater than the predetermined value, then the base station performs the AFC process using the BCCH with the finger receiver 13 in step 103. If the frequency error becomes smaller than the predetermined value and it is confirmed that the frequency is locked in the AFC process in step 104, then the mobile station stops the AFC process. Thereafter, control returns to step 101, and enters the waiting mode.

While the finger receiver 13 receives a BCCH, the finger receivers $9_1$, $9_2$ receive a PCH for thereby continuing the waiting mode.

In the mobile station according to the third embodiment, the AFC process using the BCCH is performed in the waiting mode in which the PCH is received. A PCH is a channel transmitted in a burst, whereas a BCCH is a channel transmitted at all times from the base station. Therefore, the AFC process using the BCCH is faster than the AFC process using the PCH. Consequently, no reception failure occurs even if the TCXO 3 suffers frequency fluctuations in the waiting mode.

The arrangement of the third embodiment can be realized because the BCCH has the same frequency as, but a different code from, the PCH.

4th Embodiment

A mobile station according to a fourth embodiment of the present invention operates as follows: In the waiting mode, if a frequency error measured using a PCH becomes greater than a predetermined value, then the mobile station switches at least one of the finger receivers to receive a BCCH, and performs the AFC process using the BCCH. When the frequency is locked in the AFC process, the mobile station switches the finger receiver, which has been switched to receive the BCCH, to receive the PCH.

Figure 11:
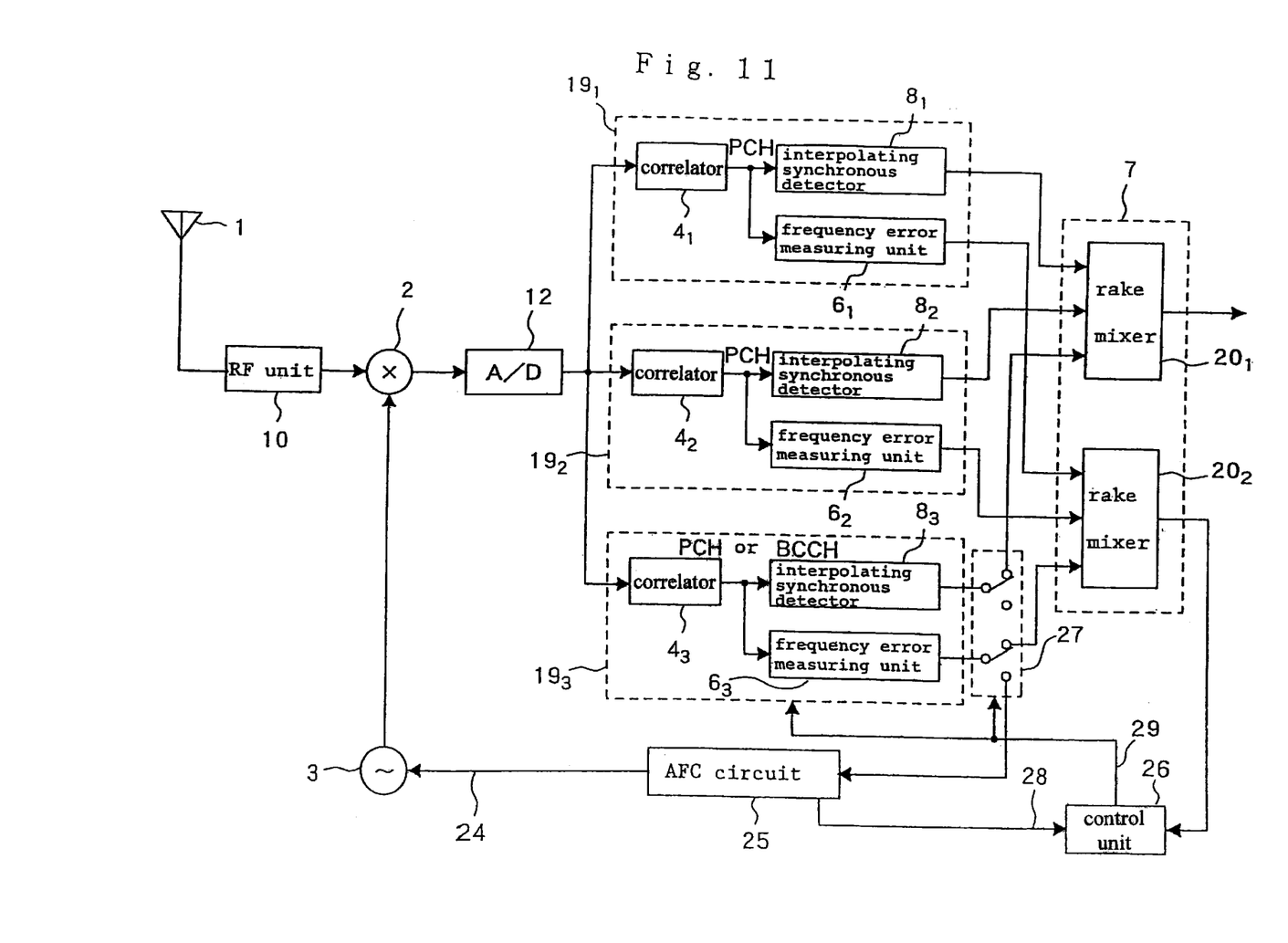
FIG. 11 is a block diagram of a mobile station according to a fourth embodiment of the present invention.

As shown in FIG. 11, the mobile station according to the fourth embodiment differs from the mobile station according to the first embodiment shown in FIG. 4 in that a switching unit 27 and a control unit 26 are newly added, and an AFC circuit 25 is provided in place of the AFC circuit 5.

If a control signal 29 from the control unit 26 is inactive, then the correlator $4_3$ of the finger receiver $19_3$ despreads a digital signal from the A/D converter 12 using a spreading code corresponding to a PCH for thereby demodulating the data of the PCH. If the control signal 29 is active, then the correlator $4_3$ despreads a digital signal from the A/D converter 12 using a spreading code corresponding to a BCCH for thereby demodulating the data of the BCCH.

If the control signal 29 is inactive, the switching unit 27 outputs an output signal from the interpolating synchronous detector $8_3$ to the rake mixer 201, and also outputs a frequency error determined by the frequency error measuring unit $6_3$ to the rake mixer $20_2$. If the control signal 29 is active, the switching unit 27 does not output an output signal from the interpolating synchronous detector $8_3$ to the rake mixer $20_1$, and outputs a frequency error determined by the frequency error measuring unit $6_3$ to the AFC circuit 25.

The AFC circuit 25 functions in the same manner as the AFC circuit 5 shown in FIG. 4, and all so functions to output an AFC lock signal 28 when the frequency is locked in the AFC circuit 25.

The control unit 26 is supplied with a frequency error determined by the rake mixer $20_2$. If the frequency error becomes greater than a predetermined value, then the control unit 26 makes the control signal 29 active, causing the AFC circuit 25 to start the AFC process. When the AFC circuit 25 outputs the AFC lock signal 28 and the control signal 26 thus detects when the frequency is locked in the AFC circuit 25, the control unit 26 makes the control signal 29 inactive.

Figure 12:
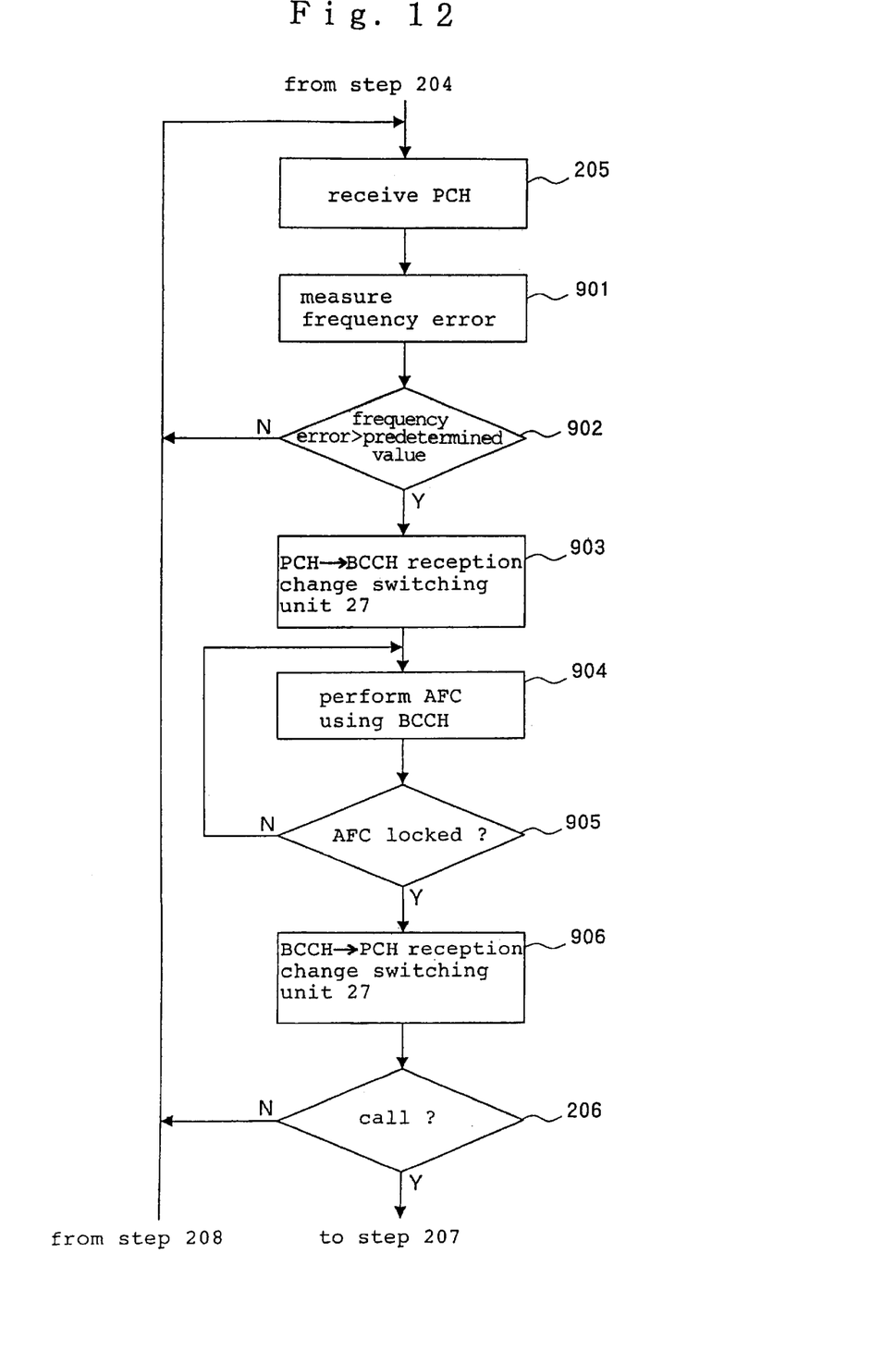
FIG. 12 is a flowchart of an operation sequence of the mobile station shown in FIG. 11.

An operation sequence of the mobile station according to the fourth embodiment will be described below with reference to FIG. 12. The operation sequence of the mobile station shown in FIG. 12 differs from the operation sequence of the mobile station shown in FIG. 3 in that new steps are added between steps 205, 206 shown in FIG. 3. FIG. 12 mainly shows those newly added steps.

When the mobile station receives a PCH in step 205, the control unit 26 measures a frequency error of the PCH in step 901. The control unit 26 then decides whether the measured frequency error is greater than a predetermined value or not in step 902. If the frequency error is greater than the predetermined value, then the control unit 26 makes the control signal 29 active to switch the finger receiver $19_3$ from a PCH reception mode to a BCCH reception mode in step 903. The control unit 26 controls the switching unit 27 such that the switching unit 27 does not output an output signal from the interpolating synchronous detector $8_3$ to the rake mixer $20_1$, and outputs a frequency error determined by the frequency error measuring unit $6_3$ to the AFC circuit 25.

In step 904, the AFC circuit 25 performs the AFC process using a BCCH. The AFC circuit 25 decides whether the frequency is locked in the AFC process or not in step 905. If the frequency is locked in the AFC process, then the AFC circuit 25 outputs an AFC lock signal 28, and the control unit 26 makes the control signal 29 inactive to switch the finger receiver $19_3$ from the BCCH reception mode to the PCH reception mode in step 906. The control unit 26 controls the switching unit 27 to output the output signal from the interpolating synchronous detector $8_3$ to the rake mixer $20_1$, and also output the frequency error determined by the frequency error measuring unit $6_3$ to the rake mixer $20_2$.

It is decided whether there is an incoming call in step 206. If there is no incoming call, then control goes back to step 205 for the reception of a PCH. If there is an incoming call, then control proceeds to step 207 (see FIG. 3).

5th Embodiment

A mobile station according to a fifth embodiment of the present invention operates as follows: In the waiting mode, the mobile station switches at least one of the finger receivers to receive a BCCH at a certain time interval, and measures a frequency error using the BCCH. When the measured frequency error becomes greater than a predetermined value, the mobile station performs the AFC process using the BCCH. When the frequency is locked in the AFC process, the mobile station switches the finger receiver, which has been switched to receive the BCCH, to receive the PCH.

Figure 13:
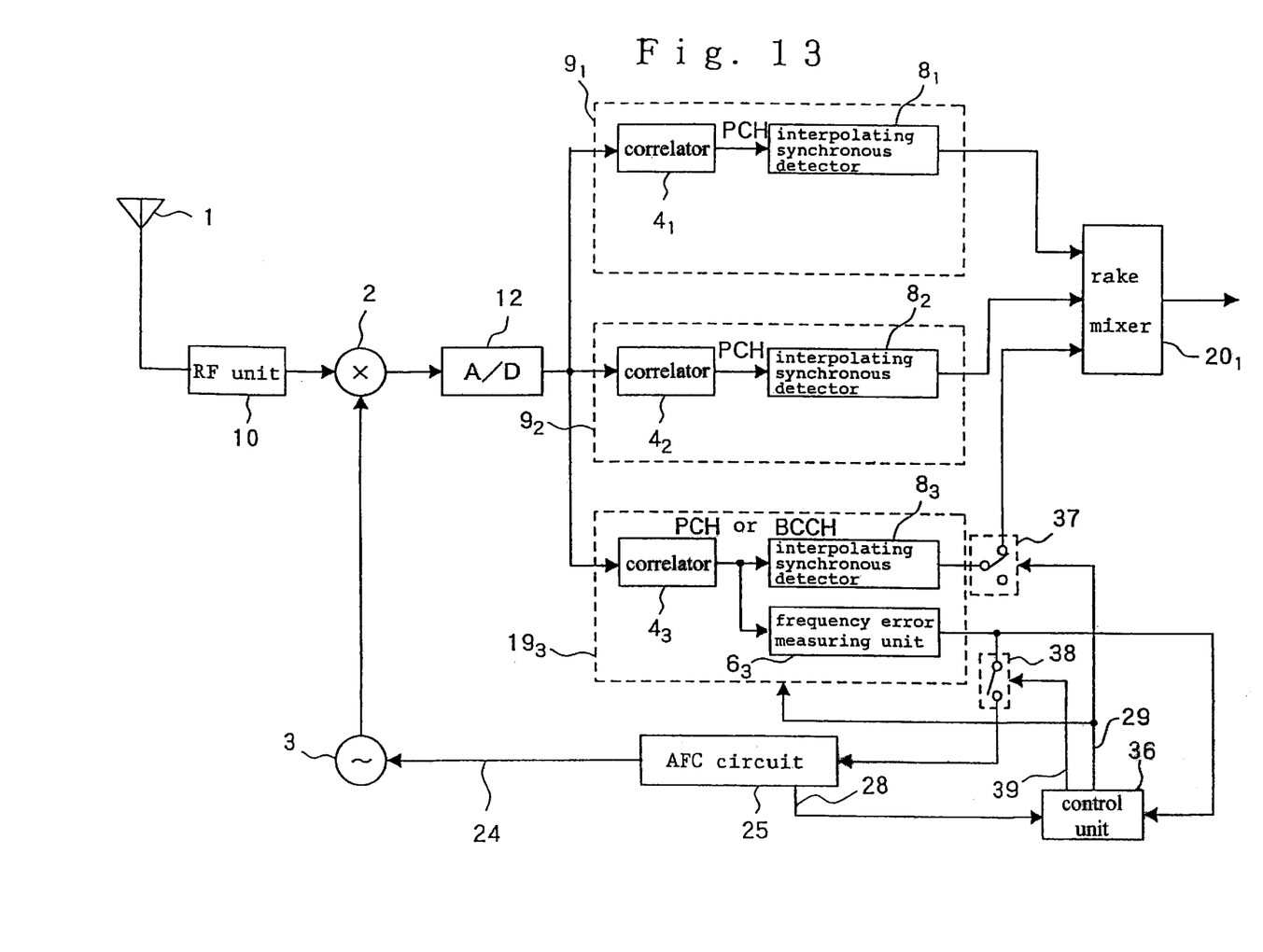
FIG. 13 is a block diagram of a mobile station according to a fifth embodiment of the present invention.

As shown in FIG. 13, the mobile station according to the fifth embodiment comprises an antenna 1, an RF unit 10, a mixer 2, a TCXO 3, an A/D converter 12, a plurality of finger receivers $9_1$, $9_2$, $19_3$, an AFC circuit 25, a rake mixer $20_1$, switching units 37, 38, and a control unit 36.

If a control signal 29 from the control unit 36 is inactive, then the switching unit 37 outputs an output signal from the interpolating synchronous detector $8_3$ to the rake mixer $20_1$. If the control signal 29 is active, the switching unit 37 does not output an output signal from the interpolating synchronous detector $8_3$ to the rake mixer $20_1$. If a control signal 39 from the control unit 26 is active, then the switching unit 38 outputs a frequency error determined by the frequency error measuring unit $6_3$ to the AFC circuit 25.

If the control signal 29 is inactive, then the correlator $4_3$ of the finger receiver $19_3$ despreads a digital signal from the A/D converter 12 using a spreading code corresponding to a PCH for thereby demodulating the data of the PCH. If the control signal 29 is active, then the correlator $4_3$ despreads a digital signal from the A/D converter 12 using a spreading code corresponding to a BCCH for thereby demodulating the data of the BCCH.

The control unit 36 makes the control signal 29 active at a certain time interval to switch the finger receiver $19_3$ from a PCH reception mode to a BCCH reception mode. If the frequency error determined by the frequency error measuring unit $6_3$ is greater than a certain value, the control unit 36 makes the control signal 39 active to output the frequency error to the AFC circuit 25. When the AFC circuit 25 outputs the AFC lock signal 28 and the control signal 26 thus detects when the frequency is locked in the AFC circuit 25, the control unit 36 makes the control signals 29, 39 inactive.

Figure 14:
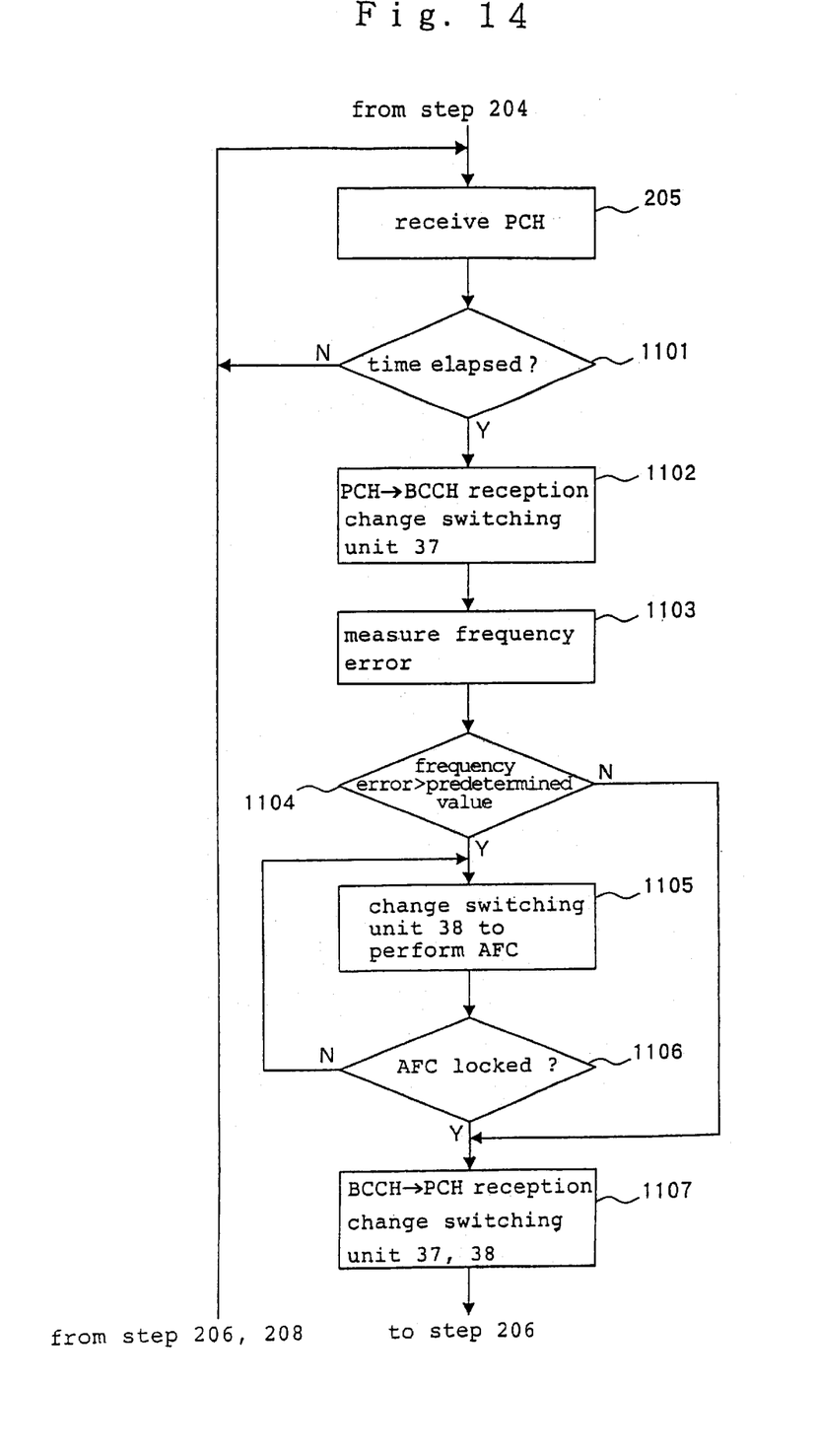
FIG. 14 is a flowchart of an operation sequence of the mobile station shown in FIG. 13.

An operation sequence of the mobile station according to the fifth embodiment will be described below with reference to FIG. 14. The operation sequence of the mobile station shown in FIG. 14 differs from the operation sequence of the mobile station shown in FIG. 3 in that new steps are added between steps 205, 206 shown in FIG. 3. FIG. 14 mainly shows those newly added steps.

When the mobile station receives a PCH in step 205, the control unit 36 decides whether a certain period of time has elapsed or not in step 1101. If the certain period of time has elapsed, then the control unit 36 makes the control signal 29 active in step 1102 to switch the finger receiver $19_3$ from the PCH reception mode to the BCCH reception mode. The control unit 36 also controls the switching unit 37 so as not to output an output signal from the interpolating synchronous detector $8_3$ to the rake mixer $20_1$.

Then, the frequency error measuring unit $6_3$ measures a frequency error in step 1103. The control unit 36 then decides whether the measured frequency error is greater than a predetermined value or not in step 1104. If the frequency error is greater than the predetermined value, then the control unit 36 makes the control signal 39 active to control the switching unit 38 to output the frequency error determined by the frequency error measuring unit $6_3$ to the AFC circuit 25, and the AFC circuit 25 performs the AFC process using a BCCH in step 1105. The AFC circuit 25 decides whether the frequency is locked in the AFC process or not in step 1106. If the frequency is locked in the AFC process, then the AFC circuit 25 outputs the AFC lock signal 28, and the control unit 36 makes the control signals 29, 39 inactive to switch the finger receiver $19_3$ from the BCCH reception mode to the PCH reception mode in step 1107. The control unit 36 controls the switching unit 37 to output the output signal from the interpolating synchronous detector $8_3$ to the rake mixer $20_1$, and not to output the frequency error determined by the frequency error measuring unit $6_3$ to the AFC circuit 25.

6th Embodiment

A mobile station according to a sixth embodiment of the present invention will be described below.

As shown in FIG. 3, if the mobile station is notified of an incoming call via the PCH in step 206 in the waiting mode, then the mobile station receives a BCCH to obtain information again from the base station in step 207. In step 208, the mobile station receives a DTCH (Data Channel) to begin speech communications.

In the sixth embodiment, when the mobile station receives a BCCH in response to an incoming call via a PCH, i.e., when the mobile station receives a BCCH before speech communications begin, the mobile station performs the AFC process using the BCCH.

In the third embodiment described above, the mobile station receives a BCCH and performs the AFC process using the BCCH in the waiting mode in which BCCHs are not received usually. According to the sixth embodiment, however, when the mobile station receives a BCCH in an ordinary process, the mobile station also performs the AFC process using the BCCH. Therefore, the mobile station can perform the AFC process using the BCCH even without assigning a finger receiver for the reception of the BCCH.

In the first through sixth embodiments, there are three finger receivers $9_1$ through $9_3$ or three finger receivers $19_1$ through $19_3$ for receiving a PCH or a BCCH. However, the principles of the present invention are also applicable to a mobile station having more or less finger receivers.

Figure 9:
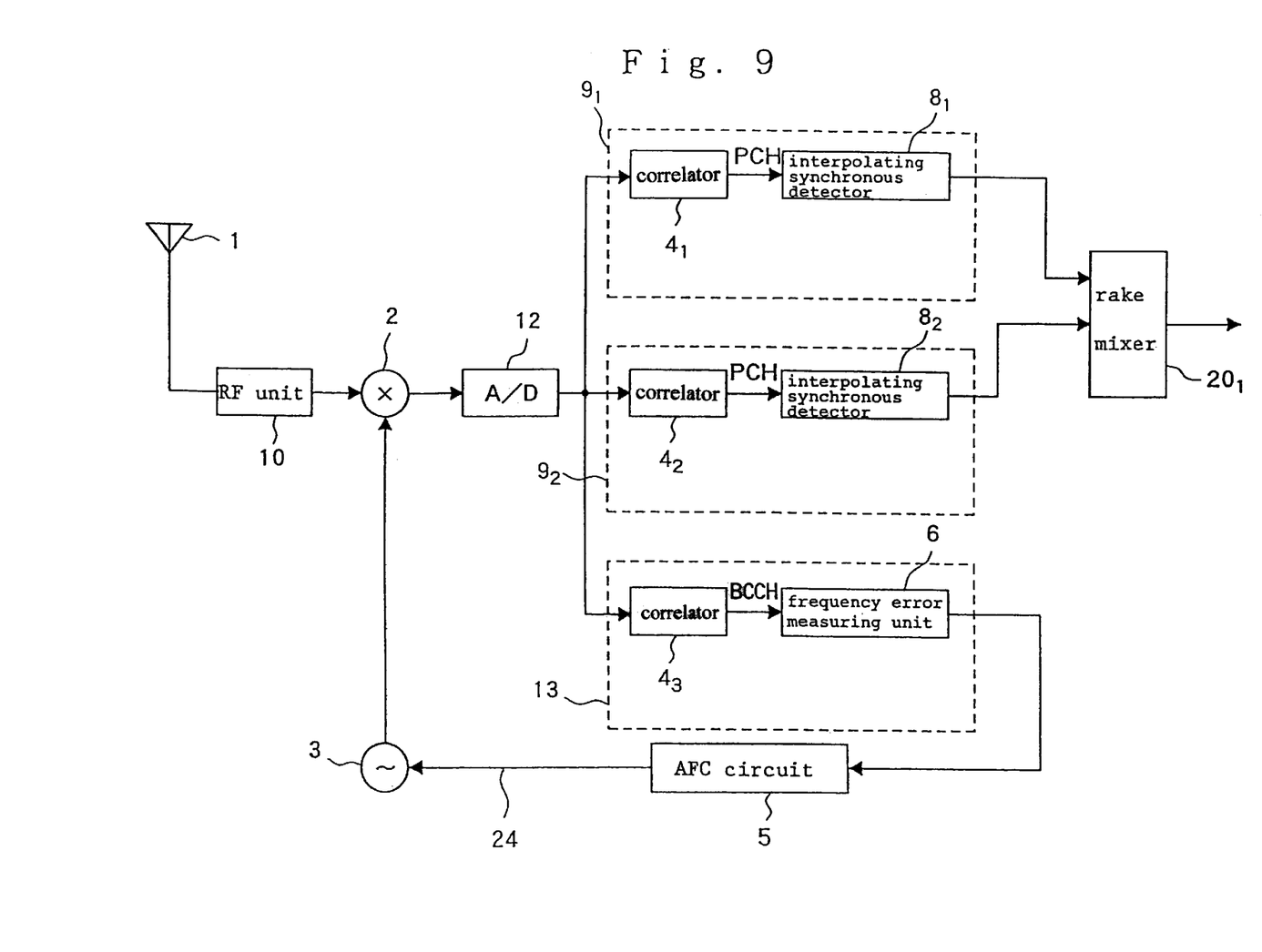
FIG. 9 is a block diagram of a mobile station according to a third embodiment of the present invention.

In the three through fifth embodiments shown in FIGS. 9, 11, and 13, only one finger receiver 13, $19_3$ is employed for receiving a BCCH. However, if the mobile station has 10 finger receivers, for example, then a plurality of, e.g., two or three, finger receivers may be assigned for receiving a BCCH. Such plural finger receivers for receiving a BCCH are effective to increase the accuracy of an obtained frequency error and hence the accuracy of the AFC process.

While preferred embodiments of the present invention have been described using specific terms, such description is for illustrative purposes only, and it is to be understood that changes and variations may be made without departing from the spirit or scope of the following claims.

What is claimed is:

1. A method of performing an automatic frequency control process in a mobile station to equalize the frequency of a reference frequency signal for use in demodulating a signal received from a base station, with the frequency of a reference frequency signal in the base station, the method comprising the step of:

receiving a broadcast control channel by one finger receiver in a waiting mode in which a paging channel transmitted from the base station to indicate whether there is an incoming call or not is being received by another finger receiver; and carrying out the automatic frequency control process using the broadcast control channel in the waiting mode.

2. A method of performing an automatic frequency control process in a mobile station to equalize the frequency of a reference frequency signal for use in demodulating a signal received from a base station, with the frequency of a reference frequency signal in the base station, the method comprising the step of:

receiving a broadcast control channel by one finger receiver in a waiting mode in which a paging channel transmitted from the base station to indicate whether there is an incoming call or not is being received by another finger receiver and a frequency error measured using the paging channel is greater than a predetermined value; and carrying out the automatic frequency control process using the broadcast control channel in the waiting mode.

3. A method according to claim 1, wherein said step of carrying out said automatic frequency control process comprises the step of controlling a reference oscillator which generates said reference frequency signal.

4. A method according to claim 2, wherein said step of carrying out said automatic frequency control process comprises the step of controlling a reference oscillator which generates said reference frequency signal.

* * * * *